US011460766B2

(12) United States Patent
Sasaki

(10) Patent No.: US 11,460,766 B2
(45) Date of Patent: Oct. 4, 2022

(54) ARTICLE STORAGE FACILITY

(71) Applicants: Taiwan Daifuku Co., Ltd., Tainan (TW); Daifuku Co., Ltd., Osaka (JP)

(72) Inventor: Isamu Sasaki, Tainan (TW)

(73) Assignees: Taiwan Daifuku Co., Ltd., Tainan (TW); Daifuku Co., Ltd., Osaka (JP)

( * ) Notice: Subject to any disclaimer, the term of this patent is extended or adjusted under 35 U.S.C. 154(b) by 356 days.

(21) Appl. No.: 16/716,812

(22) Filed: Dec. 17, 2019

(65) Prior Publication Data

US 2020/0264506 A1    Aug. 20, 2020

(30) Foreign Application Priority Data

Feb. 18, 2019    (JP) .............................. JP2019-026890

(51) Int. Cl.
*H01L 21/677*    (2006.01)
*G03F 1/66*    (2012.01)
(Continued)

(52) U.S. Cl.
CPC ............... *G03F 1/66* (2013.01); *B65G 1/137* (2013.01); *H01L 21/67359* (2013.01);
(Continued)

(58) Field of Classification Search
CPC .... G03F 1/66; G03F 7/70691; G03F 7/70741; G03F 7/7075; H01L 21/67389;
(Continued)

(56) References Cited

U.S. PATENT DOCUMENTS

2002/0023458 A1* 2/2002 Sakata ................. F27D 3/0084
62/378
2008/0023417 A1 1/2008 Yamamoto
(Continued)

FOREIGN PATENT DOCUMENTS

JP              445333 A    2/1992
JP         200044015 A    2/2000
(Continued)

*Primary Examiner* — Glenn F Myers
(74) *Attorney, Agent, or Firm* — The Webb Law Firm

(57) ABSTRACT

An article storage facility is disclosed which has a relatively high article storage efficiency and which can reduce the possibility of degradation, etc., of articles that may occur within a storage structure. The article storage facility includes: a storage structure; a first support station provided inside the storage structure and configured to support a storage container; a second support station configured to support a transporting container; and an article transfer device. A transporting container is a container that is used to transport articles outside the storage structure whereas a storage container is a container that is used to transport and store articles inside the storage structure, and is configured to hold a plurality of articles with greater holding efficiency than a transporting container. The article transfer device is configured to transfer articles, one or more articles at a time, between a storage container placed on the first support station and a transporting container placed on the second support station.

9 Claims, 4 Drawing Sheets

(51) Int. Cl.
*H01L 21/673* (2006.01)
*B65G 1/137* (2006.01)

(52) U.S. Cl.
CPC .. *H01L 21/67389* (2013.01); *H01L 21/67736* (2013.01); *H01L 21/67769* (2013.01); *Y10S 414/14* (2013.01)

(58) Field of Classification Search
CPC ......... H01L 21/67757; H01L 21/67733; H01L 21/67353; H01L 21/67736; H01L 21/67359; H01L 21/6773; H01L 21/67769; H01L 21/67303; H01L 21/67778; H01L 21/67781; H01L 21/67748; Y10S 414/14; B65G 1/137; B65G 1/0407; B65G 1/0428; B65G 1/0478
See application file for complete search history.

(56) References Cited

U.S. PATENT DOCUMENTS

| | | | | |
|---|---|---|---|---|
| 2013/0065189 | A1* | 3/2013 | Yoshii | C23C 16/463 432/9 |
| 2013/0247937 | A1* | 9/2013 | Nunomura | H01L 21/67745 156/345.24 |
| 2016/0211157 | A1* | 7/2016 | Inoshima | H01L 21/67253 |

FOREIGN PATENT DOCUMENTS

| | | |
|---|---|---|
| JP | 200585913 A | 3/2005 |
| JP | 200830914 A | 2/2008 |
| JP | 2013102235 A | 5/2013 |

* cited by examiner

ARTICLE STORAGE FACILITY

CROSS-REFERENCE TO RELATED APPLICATION

This application claims priority to Japanese Patent Application No. 2019-026890 filed Feb. 18, 2019, the disclosure of which is hereby incorporated by reference in its entirety.

FIELD OF THE INVENTION

The present invention relates to an article storage facility.

BACKGROUND ART

Patent Document 1 (JP patent publication No. 4215079), for example, discloses an article storage facility for storing reticles (articles) which are used in an exposure phase in manufacturing of semiconductor substrates. The reference numerals in brackets in the following description in this BACKGROUND ART section are those used in Patent Document 1.

In the technology of Patent Document 1, a pod (26) with reticles held inside is transported to one of load ports (18 or 19) which are provided adjacent a clean stocker (2) for storing reticles and which are provided for ceiling or overhead travel vehicles. And the reticles are removed by the pod opener (12) from the pod (26) that has been transported from the load port (18, 19) to inside the stocker (2). The reticles so removed are stored in a rotary rack for storing reticles (4) by a reticle transport device (10) whereas the empty pod (26) is stored in a rotary rack for pods (6) by a pod transport device (8). Thus, the reticles removed from the pods (26) and empty pods (26) are stored separately within the stocker (2).

SUMMARY OF THE INVENTION

As described above, in the technology of Patent Document 1, the reticles are removed from the pod (26) and are transported and stored within the stocker (2) with the reticles out of the pod (26). Thus, degradation, etc., of the reticles may occur during the transporting and/or storing of the reticles within the stocker (2). On the other hand, in order to reduce the possibility of such degradation, etc., of reticles, it is conceivable to handle the reticles within the stocker (2) with the reticles still held in a pod (26). However, a pod (26) used to transport reticles needs to satisfy constraints such as the requirement to have a flange (28) for facilitating the handling of the pod (26) by a transport device. Thus, such pod (26) tends to be larger in size than a pod (26) that only needs to store reticles. Thus, when the arrangement is such that the reticles are stored within a stocker (2) with the reticles still held in pods (26) for being transported, it is necessary to secure the space sufficient to accommodate the volume of such pods (26) in a stocker (2). Thus, there is room for improvement in terms of the reticle storage efficiency of such a stocker (2).

In light of the background described above, an article storage facility is desired which has a relatively high article storage efficiency and which can reduce the possibility of degradation, etc., of articles that may occur within the storage structure.

An article storage facility in accordance with the present disclosure comprises: a storage structure; one or more storage racks provided inside the storage structure and configured to store storage containers; a first support station provided inside the storage structure and configured to support a storage container; an internal transport device configured to transport storage containers, one storage container at a time, between the one or more storage racks and the first support station; a second support station provided outside the storage structure and configured to support a transporting container; an article transfer device; wherein a transporting container is a container that is used to transport articles outside the storage structure, and is configured to hold a plurality of articles therein, wherein a storage container is a container that is used to transport and store articles inside the storage structure, and is configured to hold a plurality of articles with greater holding efficiency than a transporting container, and wherein the article transfer device is configured to transfer articles, one or more articles at a time, between a storage container placed on the first support station and a transporting container placed on the second support station.

With such an arrangement, storage containers, having greater holding efficiency than transporting containers used to transport articles outside the storage structure, are used when storing articles in the storage structure. Thus, the article storage efficiency can be improved compared to a case in which articles are stored in the storage structure with the articles still held in transporting containers. Further, with the arranged described above, because articles are transported and stored with articles held in storage containers inside the storage structure, it is possible to reduce the possibility of degradation, etc., of the articles, compared with a case in which articles are transported and stored without the use of containers to hold them therein.

Additional features and advantages of the technology in accordance with the present disclosure will be made clear by the following description of various non-limiting example embodiments of the present disclosure described with reference to the attached drawings.

DETAILED DESCRIPTION OF EMBODIMENTS

The article storage facility is a facility configured to transport and store articles, and is used in, for example, a semiconductor manufacturing facility. Embodiments of the article storage facility are described next with reference to the drawings, using an example in which the facility is used in a semiconductor manufacturing facility.

[Summary of the Structure of an Article Storage Facility]

Figure 1:
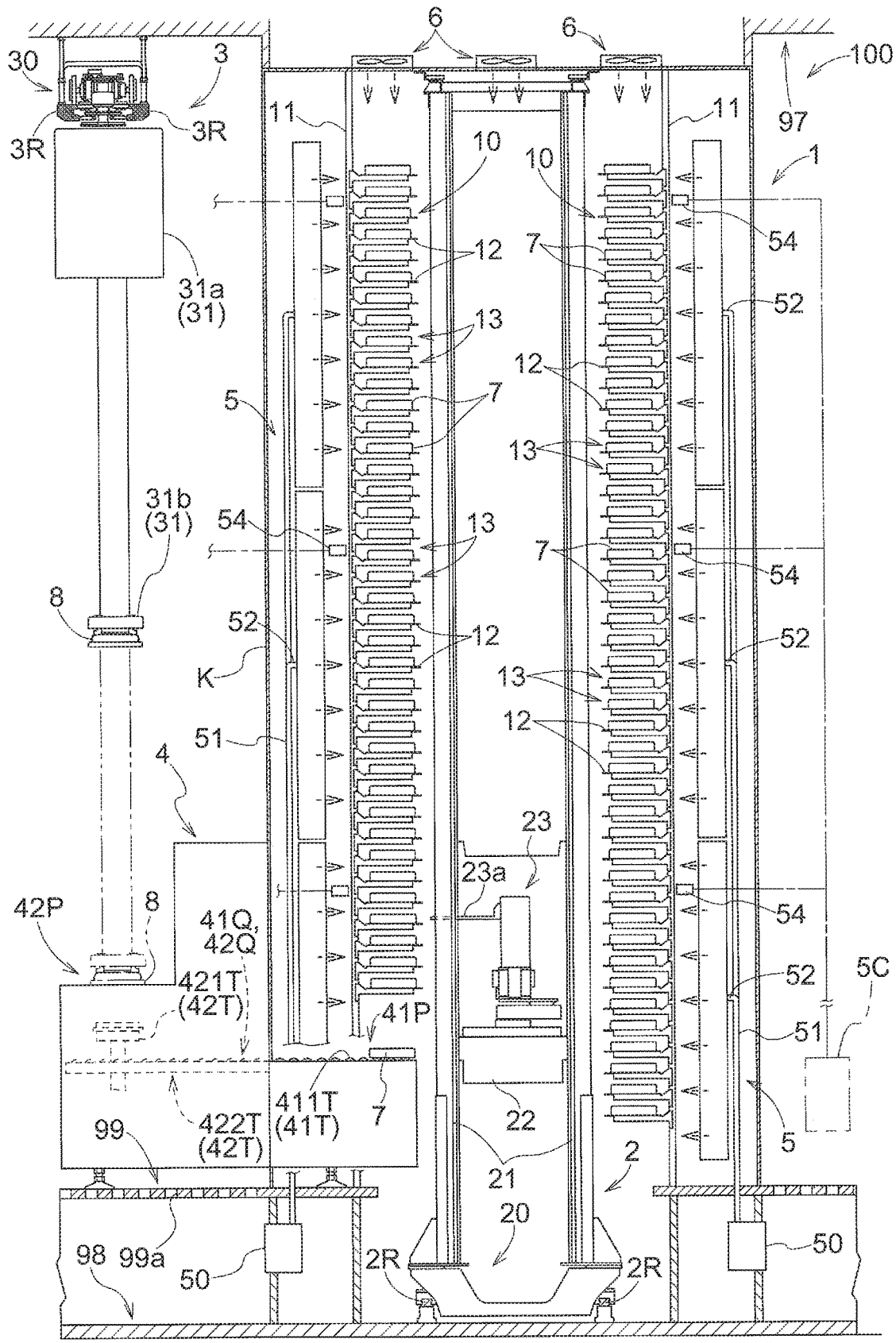
FIG. 1 is a side view of an article storage facility.

As shown in FIG. 1, the article storage facility 100 is provided in a clean room of a down-flow type in which gas is caused to flow from a top area toward a bottom area. In the present embodiment, the article storage facility 100 includes an upper floor portion 99 which has ventilating holes 99a (i.e., holes that allow passage of gas) that extend along a vertical direction and through the upper floor portion 99, and a lower floor portion 98 which is located below the upper floor portion 99 and which is formed to extend continuously along horizontal directions (i.e., does not have ventilating holes). In addition, gas eject openings (not shown) are formed in the ceiling portion 97 of the clean room. And gas is ejected downward through the gas eject openings. This causes the gas to flow from an upper area toward a lower area in the clean room. And after flowing into the area below the upper floor portion 99 through the ventilating holes 99*a*, the gas flows horizontally between the upper floor portion 99 and the lower floor portion 98. And the gas that has flowed between the upper floor portion 99 and the lower floor portion 98 is supplied back into the gas eject holes in the ceiling portion 97 through one or more connecting channels (not shown). Thus, gas is caused to circulate through the clean room. While not described in detail, it would be preferable if an air filter is provided in each connecting channel to clean the gas.

The article storage facility 100 includes a storage structure 1 for storing articles W. In the present example, each article W is an object that is flat and thin (thickness is less than horizontal dimensions) (see FIG. 3). In the present embodiment, each article W is a reticle (photomask) used in an exposure phase. Reticles are an example of articles W each of which has one or more portions or materials that require a specific atmosphere containing gas having specific composition to maintain required quality. While details are not shown in the drawings, in the present example, a plurality of articles W (reticles) are transported and stored together, with such plurality of articles held in a reticle protection member (commonly referred to as a clean filter pod). In the present example, within the storage 1, a plurality of articles W are transported and stored with the articles W held in a reticle protection member which is in turn held in a storage container 7 whereas, outside the storage 1, a plurality of articles W are transported with the articles W held in a reticle protection member which is in turn held in a transporting container 8. In addition, a plurality of articles W are transferred between a transporting container 8 and a storage container 7 with such articles held in a reticle protection member. Note that, in the following descriptions of the present example, the expression "article W" in a singular form refers to one reticle whereas "articles W" may refer to a plurality of reticles that are held in a reticle protection member which is a unit of transporting and storage (i.e., each transport device transports one reticle protection member at a time (in a container). And one reticle protection member (in a container) is stored at one storage location).

The article storage facility 100 includes storage racks 10 provided inside the storage structure 1 and configured to store storage containers 7 (so called because they are containers to be stored in storage racks 10), an internal transport device 2 configured to transport storage containers 7, one storage container 7 at a time, inside the storage structure 1, an external transport device 3 configured to transport transporting containers 8, one transporting container 8 at a time, outside the storage structure 1, and an article transfer device 4 configured to transfer articles W between a storage container 7 and a transporting container 8.

In addition, the article storage facility 100 includes a first support station 41P which is provided inside the storage structure 1 is configured for a storage container 7 to be placed thereon (i.e., configured to support a storage container 7), and a second support station 42P which is provided outside the storage structure 1 for a transporting container 8 to be placed thereon (i.e., configured to support a storage container 7). One end portion of the first conveyor 411T (described below) may function as the first support station 41P. The internal transport device 2 is configured to transport storage containers 7, one storage container 7 at a time, between the storage racks 10 and the first support station 41P. In other words, the first support station 41P is configured to receive a storage container 7 from the internal transport device 2 configured to transport a storage container 7 inside the storage structure 1. The external transport device 3 is configured to transport transporting containers 8, one transporting container 8 at a time, between: (a) transport target locations (for example, processing devices each of which performs one or more operations on semiconductor substrates, among other locations) and (b) a second support station 42P which is provided outside the storage structure 1. In other words, the second support station 42P is configured to receive a transporting container 8 from an external transport device 3 configured to transport transporting containers 7, one transporting container 7 at a time, outside the storage structure 1. The article transfer device 4 is configured to transfer articles W between a storage container 7 placed on the first support station 41P and a transporting container 8 placed on the second support station 42P.

[Storage Structure]

As shown in FIG. 1, the storage structure 1 has walls K that separate the area inside the storage structure 1 from the area outside thereof. The storage racks 10 configured to store the storage containers 7 are provided inside the storage structure 1. In the example shown, the internal transport device 2 is located between the two storage racks 10 with one on each side of the internal transport device 2. The two storage racks 10 have a set number (which means a number set in advance) of storage locations 13, each configured to store a storage container 7 (i.e., the sum of the number of storage locations 13 that belong to one of the storage racks 10 and the number of storage locations 3 that belong to the other of the storage racks 10 is the set number). This set number can be set as desired depending on the size of the facility and on what the facility is used for. In the present embodiment, either (a) a non-empty storage container 7*f* which is a storage container 7 with articles W held therein, or (b) an empty storage container 7*e* which is a storage container 7 with no articles W held therein is stored at each of the set number of storage locations 13. In other words, except when, for example, a storage container 7 is being transported inside the storage structure 1, either a non-empty storage container 7*f* or an empty storage container 7*e* is always stored at each of the set number of storage locations 13.

In the present embodiment, each storage rack 10 has support frame members 11 extending along a vertical direction, and shelf members 12 each configured to support a storage container 7 from below. In the present example, each shelf member 12 provides one or more storage locations 13 each configured to store a storage container 7. One shelf member 12 may provide one storage location 13 so that each shelf member 12 is configured to have one storage container 7 placed thereon. Alternatively, one shelf member 12 may provide a plurality of storage locations 13 so that each shelf member 12 is configured to have the plurality of storage containers 7 placed thereon.

Figure 2:
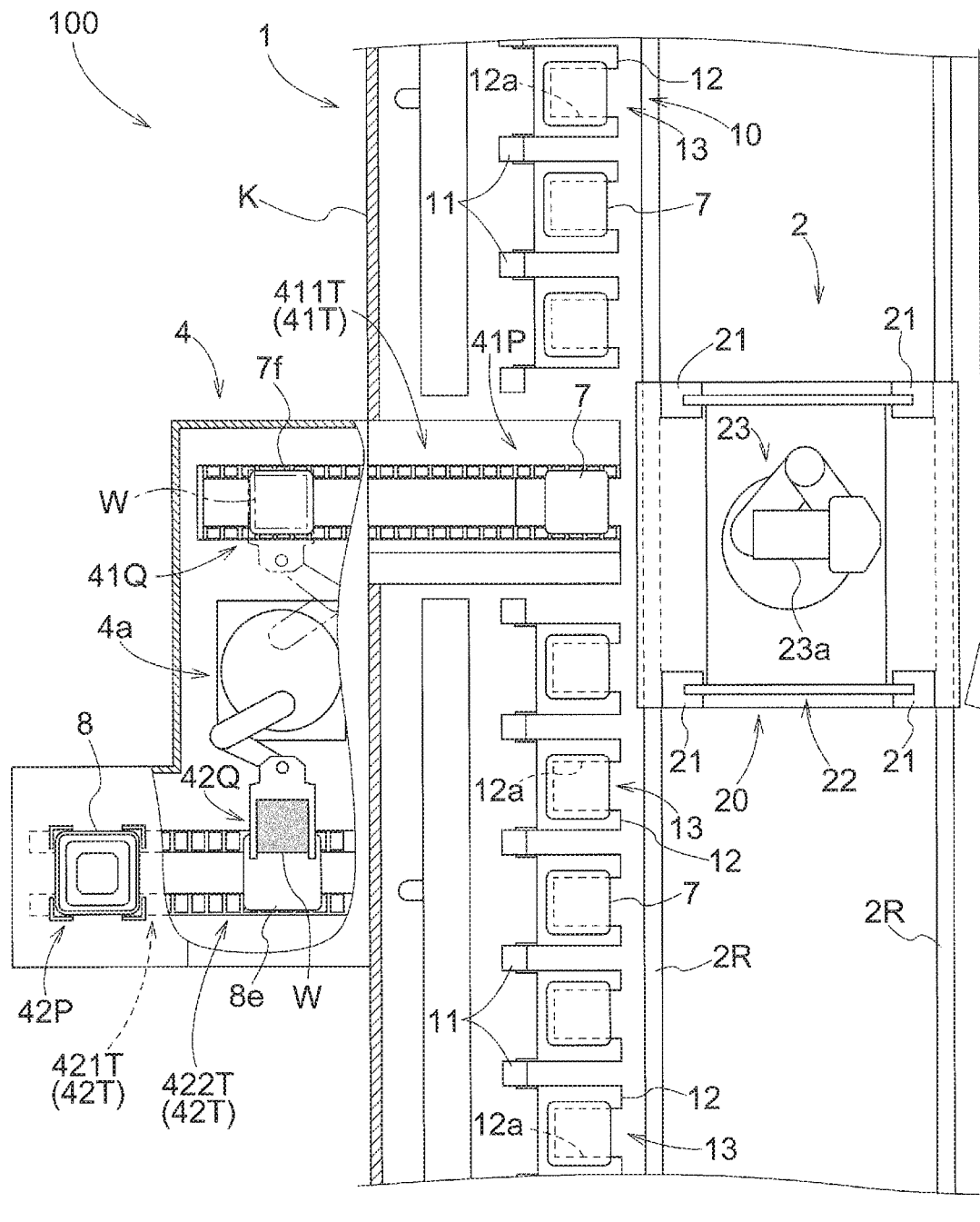
FIG. 2 is a plan view or top down view showing an article transfer device and an area around the article transfer device.

A plurality of support frame members 11 are provided, and are laterally supported by beam members (not shown). Each shelf member 12 is supported by at least one of: (a) a beam member and (b) one or more support frame members 11. As shown in FIG. 2, in the present embodiment, each shelf member 12 has a cutout portion 12*a* through which a container transfer device 23 of the internal transport device 2 can pass along the vertical direction. As will be described in more detail below, a storage container 7 can be transferred between the container transfer device 23 and a shelf member 12 as a result of the fact that the container transfer device 23 can pass through the cutout portion 12a of the shelf member 12 along the vertical direction. However, a shelf member is not limited to such an arrangement. Instead, a shelf member 12 does not have a cutout portion 12a so long as it is so configured to allow the container transfer device 23 to transfer a storage container 7.

In the present embodiment, blowers 6 for causing gas to flow downward are provided in an upper portion of the storage structure 1. This allows downflow of gas to be formed inside the storage structure 1 as well to keep the area inside the storage structure 1 clean where it is difficult for contaminating particles to move freely.

[Internal Transport Device]

The internal transport device 2 is provided inside the storage structure 1, and is configured to transport storage containers 7, one storage container 7 at a time. The internal transport device 2 is, for example, a stacker crane.

As shown in FIG. 1, in the present embodiment, the internal transport device 2 includes internal rails 2R which are provided between the two storage racks 10 so positioned to face each other and which extend along a lateral width direction of the storage racks 10 (i.e., into the paper in FIG. 1), a travel member 20 configured to travel along the internal rails 2R, masts 21 which are provided on the travel member 20 and extend along the vertical direction, a vertically movable member 22 configured to be raised and lowered along the masts 21, and a container transfer device 23 which is provided to the vertically movable member 22 and is configured to transfer a storage container 7.

The container transfer device 23 has a transferring arm 23a which can support a storage container 7 from below and can be extended and retracted by means of arms pivotable with respect to each other at a joint (see also FIG. 2) and actuated by one or more electric motors. The container transfer device 23 may be, for example, a SCARA robot or an articulated robot with the transferring arm 23a having a generally flat support member at the free end. The container transfer device 23 transfers a storage container 7 to a shelf member 12 (a storage location 13) as a result of, for example, the transferring arm 23a moving through the cutout portion 12a of the shelf member 12 (from a location above the shelf member 12 to a location below the shelf member 12) with the storage container 7 supported by the transferring arm 23a. In addition, the container transfer device 23 receives a storage container 7 from a shelf member 12 (a storage location 13) as a result of the transferring arm 23a moving through the cutout portion 12a (from a location below the shelf member 12 to a location above the shelf member 12) when the storage container 7 is supported by the shelf member 12. With the arrangement described above, the internal transport device 2 can transfer a storage container 7 to or from any of the plurality of storage locations 13 (in either of the storage racks 10) which are arranged one above another along the vertical direction and which are also arranged one adjacent another along the lateral width direction of the storage racks 10.

[External Transport Device]

An external transport device 3 (more than one of which may be provided to the facility) is provided outside the storage structure 1, and is configured to transport transporting containers 8, one transporting container 8 at a time. An external transport device 3 is, for example, a ceiling or overhead transport vehicle of a hoist type which travels near a ceiling.

As shown in FIG. 1, in the present embodiment, an external transport device 3 includes external rails 3R disposed parallel to the ceiling, a travel portion 30 configured to travel on the external rails 3R, and a transport main body portion 31 suspended and supported by the travel portion 30 and located below the external rails 3R.

The transport main body portion 31 includes a cover portion 31a and a grip portion 31b. The cover portion 31a is formed in a shape whose lower portion is open, and is configured to accommodate the grip portion 31b and a transporting container 8. The grip portion 31b is configured to be capable of gripping or holding a transporting container 8 and to be raised and lowered between a transport position set within the cover portion 31a, and a container transfer position set to be lower than the transport position.

The transport position is a position at which the grip portion 31b is accommodated in the cover portion 31a. The external transport device 3 transports a transporting container 8 as a result of the travel portion 30 traveling on the external rails 3R with the grip portion 31b gripping or holding the transporting container 8 and located at the transport position. The container transfer position is a position at which the lowest portion of the grip portion 31b is located lower than the lowest portion of the cover portion 31a. The container transfer position is set depending on the height of the transfer target location to or from which a transporting container 8 is transferred. The external transport device 3 transfers a transporting container 8 to or from a transfer target location such as the second support station 42P as a result of the grip portion 31b performing a gripping operation or releasing operation with the grip portion 31b located at a transfer position.

[Article Transfer Device]

The article transfer device 4 is configured to transfer articles W between a storage container 7 placed on the first support station 41P and a transporting container 8 placed on the second support station 42P. When a reticle protection member is used as with the present example, the article transfer device 4 configured to transfer articles W should be understood to be configured to transfer a reticle protection member (i.e., to transfer the articles W through a reticle protection member). As shown in FIGS. 1 and 2, in the present embodiment, the first support station 41P and the second support station 42P are provided to the article transfer device 4. As described above, the first support station 41P is provided inside the storage structure 1 whereas the second support station 42P is provided outside the storage structure 1. Therefore, in the present embodiment, the article transfer device 4 is located to extend between inside and outside of the storage structure 1. In other words, the article transfer device 4 is so located to extend through an opening in a wall K of the storage structure 1.

As shown in FIG. 2, in the present embodiment, the article transfer device 4 includes a transfer arm 4a which is configured to be capable of holding articles W (through a reticle protection member when such is used, as with the present example) and transferring them between a storage container 7 and a transporting container 8, and one or more container openers (not shown) configured to open a container (storage container 7 and/or transporting container 8). In the example shown, the transfer arm 4a is configured to be capable of being extended and retracted (as a result of having arms connected to each other and pivotable at one or more joints and actuated by one or more electric motors) and of turning about a vertical axis with a use of a turning mechanism. The transfer arm 4a may be, for example, a SCARA robot or an articulated robot which has a member (such as a gripper) configured to hold articles W (through the reticle protection member in the present example) and which is located on a turn table. Because the transfer arm 4a has these mechanisms, it can move articles W properly between a storage container 7 and a transporting container 8 while keeping the area swept by the transfer arm 4a movement small. However, the structure of the transfer arm 4a is not limited to the one just described. Instead, other mechanism or mechanisms may be used in place of, or in addition to, one or more of these mechanisms.

As shown in FIGS. 1 and 2, in the present embodiment, the article transfer device 4 further includes a first transporting portion 41T configured to transport a storage container 7 from the first support station 41P to a location inside the article transfer device 4, and a second transporting portion 42T configured to transport a transporting container 8 from the second support station 42P to a location inside the article transfer device 4.

In the present example, the first transporting portion 41T transports a storage container 7 between the first support station 41P and a first article transfer position 41Q at which articles W are transferred to or from a storage container 7 by the transfer arm 4a. In the example shown, the first transporting portion 41T includes a first conveyor 411T configured to transport a storage container 7 horizontally. The first conveyor 411T may be a belt conveyor or a roller conveyor.

In addition, in the present example, the second transporting portion 42T transports a transporting container 8 between the second support station 42P and a second article transfer position 42Q at which articles W are transferred to or from a transporting container 8 by the transfer arm 4a. In the example shown, the second transporting portion 42T includes a second lifter 421T which is configured to transport a transporting container 8 along a vertical direction, and a second conveyor 422T configured to transport a transporting container 8 horizontally. The second conveyor 422T may be a belt conveyor or a roller conveyor. The second lifter 421T may be of any conventional construction such as a platform supported by a vertical column which is vertically moved by means of, for example, a straight gear rack fixed to the vertical column and one or more meshing gears actuated by an actuator such as an electric motor. For example, with a transporting container 8 placed on the second support station 42P, the second lifter 421T transports the transporting container 8 from the second support station 42P to a position below (i.e., to inside the article transfer device 4) where the transporting container 8 is transported horizontally to the second article transfer position 42Q by the second conveyor 422T.

In the present example, the first article transfer position 41Q and the second article transfer position 42Q are set to be located at the same height. And the second article transfer position 42Q is set to be located lower than the second support station 42P (see FIG. 1). In the present example, the second lifter 421T makes it possible for a transporting container 8 placed on the second support station 42P to be moved to the same height as the second article transfer position 42Q (i.e., the same height as the first article transfer position 41Q). This allows a transporting container 8 to be properly transported to the second article transfer position 42Q. In addition, when the second lifter 421T lowers a transporting container 8 from the second support station 42P, the second lifter 421T may also separate the transporting container 8 into a base portion 80a on which the articles W are placed and a cover 80b (see FIG. 3). In this case, the second lifter 421T also serves as a container opener.

[Storing and Retrieving Articles]

How articles W are stored in and retrieved from the storage structure 1 is described next.

When carrying, and thus storing, articles W into the storage structure 1, a non-empty transporting container which is a transporting container 8 with articles W held therein is transported to the second support station 42P by an external transport device 3. The non-empty transporting container 8f transported to the second support station 42P is transported by the second transporting portion 42T to the second article transfer position 42Q inside the article transfer device 4. And the non-empty transporting container 8f is opened by a container opener (not shown and may be a SCARA arm with a gripper to remove the cover 80b). Note that the non-empty transporting container 8f may be opened by a container opener before the transporting container 8f reaches the second article transfer position 42Q.

In addition, while the non-empty transporting container 8f is being transported, an empty storage container 7e which is a storage container 7 that has no articles W held therein is transported to the first support station 41P by the internal transport device 2. The empty storage container 7e which has been transported to the first support station 41P is transported to the first article transfer position 41Q inside the article transfer device 4 by the first transporting portion 41T. And the empty storage container 7e is opened by a container opener (not shown and may be a SCARA arm with a gripper to remove a cover member 71 described below). Thus the empty storage container 7e is now ready to receive articles W at the first article transfer position 41Q. Note that the empty storage container 7e may be opened by the container opener before the storage container 7e reaches the first article transfer position 41Q.

Subsequently, at the second article transfer position 42Q, the articles W held in the transporting container 8 are removed by the transfer arm 4a. And the transfer arm 4a moves the articles W (that have been removed from the transporting container 8) from the second article transfer position 42Q to the first article transfer position 41Q, and places the articles W in the empty storage container 7e which has been ready to receive them at the first article transfer position 41Q.

After the articles W have been placed in the empty storage container 7e by the transfer arm 4a, the now non-empty storage container 7f which is a storage container 7 with the articles W held therein is transported by the first transporting portion 41T from the first article transfer position 41Q to the first support station 41P. And the internal transport device 2 transports the non-empty storage container 7f (that has been transported to the first support station 41P) to a storage location 13 at which no storage container 7 (no non-empty storage container 7f nor empty storage container 7e) is stored among the set number of storage locations 13. This completes the carrying in, and thus storing of, the articles W into the storage structure 1.

Note that, in the present embodiment, the empty transporting container 8e, which is the transporting container 8 from which the articles W were removed by the article transfer device 4 and which is now empty (i.e., no articles W are held inside), is transported by the second transporting portion 42T to the second support station 42P. And an external transport device 3 then transports the empty transporting container 8e from the second support station 42P to a transport target location located outside the storage structure 1. Thus, the empty transporting container 8e which does not need to hold articles W at that time can be removed from the second support station 42P to a location (a transport target location) other than the second support station 42P. This allows, for example, other non-empty transporting container 8f, which holds therein articles W that need to be transferred to a storage container 7, to be transported to the second support station 42P, thus improving operational efficiency of the facility.

Next, when carrying out, and thus retrieving articles W, a non-empty storage container 7*f* which is a storage container 7 with articles W held therein is transported from a storage location 13 to the first support station 41P by the internal transport device 2. The non-empty storage container 7*f* that has been transported to the first support station 41P is transported by the first transporting portion 41T to the first article transfer position 41Q inside the article transfer device 4. And the non-empty storage container 7*f* is opened by a container opener (not shown). Note that the non-empty storage container 7*f* may be opened by the container opener before the storage container 7*f* reaches the first article transfer position 41Q.

In addition, while the non-empty storage container 7*f* is being transported, an empty transporting container 8*e* which is a transporting container 8 with no articles W held therein is transported to the second support station 42P by the external transport device 3. The empty transporting container 8*e* which has been transported to the second support station 42P is transported to the second article transfer position 42Q inside the article transfer device 4 by the second transporting portion 42T. And the empty transporting container 8*e* is opened by a container opener (not shown). Thus the empty transporting container 8*e* is now ready to receive articles W at the second article transfer position 42Q. Note that the empty transporting container 8*e* may be opened by the container opener before the transporting container 8*e* reaches the second article transfer position 42Q.

Subsequently, at the first article transfer position 41Q, articles W held in the storage container 7 are removed by the transfer arm 4*a*. And the transfer arm 4*a* moves the articles W (that have been removed from the storage container 7) from the first article transfer position 41Q to the second article transfer position 42Q, and places the articles W in the empty transporting container 8*e* which has been ready to receive them at the second article transfer position 42Q.

After the articles W (in the reticle protection member) are placed in the empty transporting container 8*e* by the transfer arm 4*a*, the now non-empty transporting container 8*f* which is a transporting container 8 with the articles W held therein is transported by the second transporting portion 42T from the second article transfer position 42Q to the second support station 42P. And the external transport device 3 transports the non-empty transporting container 8*f*, which has been transported to the second support station 42P, to a transport target location located outside the storage structure 1. This completes the carrying out, and thus retrieving of, the articles W from the storage structure 1.

[Containers]

The containers (storage containers 7 and transporting containers 8) are described with reference to FIG. 3 next.

A transporting container 8 is a container that is used to transport articles W outside the storage structure 1 and is configured to hold a plurality of articles W. When a reticle protection member is used as with the present example, and a container 7 or 8 configured to hold a plurality of articles W should be understood to be configured to hold a reticle protection member (i.e., to hold the plurality of articles W through a reticle protection member). As described above, in the present embodiment, each article W is a reticle, and a plurality of reticles are transported and stored together, with these reticles held in a reticle protection member (commonly referred to as a clean filter pod: not shown). In the present embodiment, the transporting containers 8 have a structure that allows them to have a greater hermetically sealing capability than the storage containers 7. This allows the environment inside a transporting container 8 to be isolated from the outside, thus facilitating in reducing any degradation, etc., of the articles W during the transporting.

Figure 3:
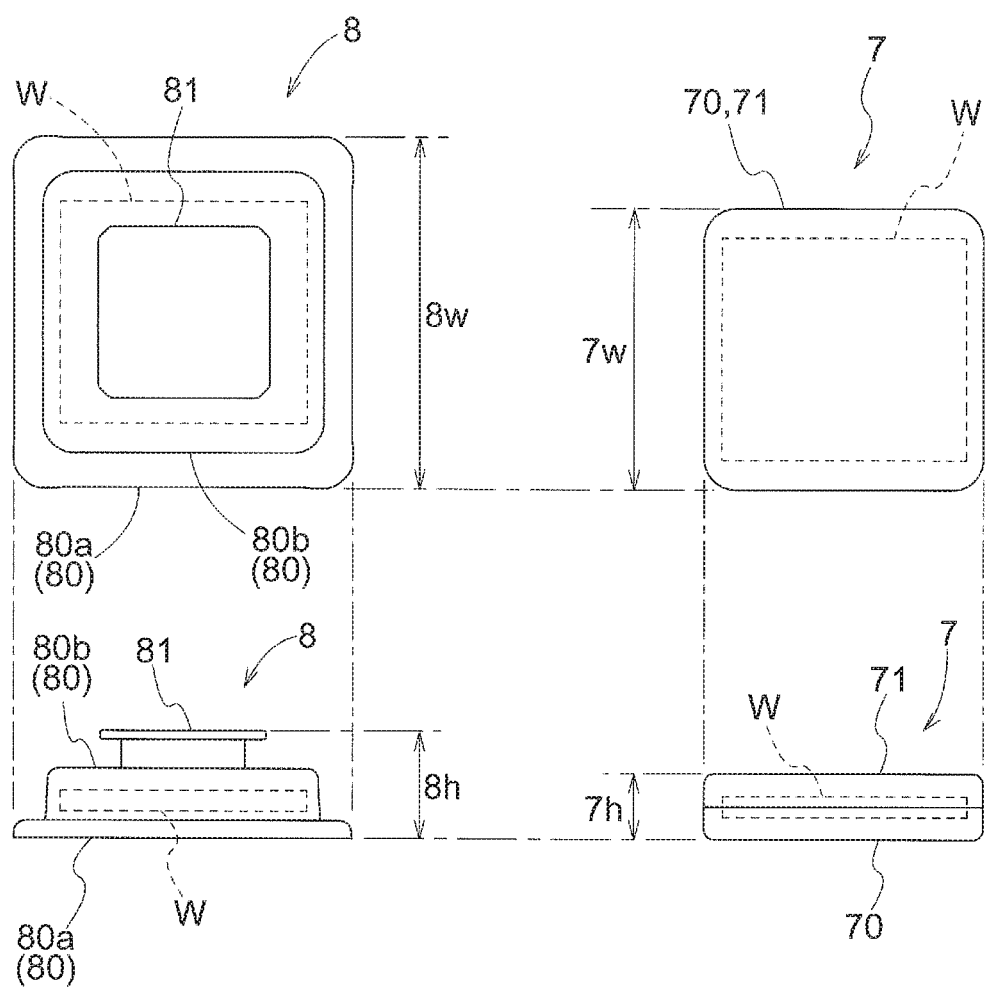
FIG. 3 is a figure in which a transporting container and a storage container are compared, and FIG. 4 schematically shows a system configured to supply gas having specific composition.

As shown in FIG. 3, in the present embodiment, the transporting container 8 has a main body portion 80 having a generally box shape that is capable of enclosing articles W, and a flange portion 81 (for transporting purposes) formed to protrude from the main body portion 80. The main body portion 80 has a base portion 80*a* on which the articles W are placed, and a cover 80*b* which covers, from above, the articles W placed on the base portion 80*a*. In addition, in the present example, the flange portion 81 is formed to protrude upward from an upper portion (cover 80*b*) of the main body portion 80. This feature makes the vertical dimension of a transporting container 8 greater than that of a storage container 7.

Each storage container 7 It is a container used to transport and store articles W inside the storage structure 1, and is configured to hold a plurality of articles with greater holding efficiency than a transporting container. In the present example, each storage container 7 is capable of holding the same number of articles W as the number of the articles W each transporting container 8 is capable of holding. And the volume occupied by each storage container 7 is less than that of the transporting container 8. This makes it possible for a storage container 7 to have a relatively large volume of the article accommodating space relative to the volume occupied by the storage container 7, allowing the storage container 7 to have a greater holding efficiency than a transporting container 8.

As shown in FIG. 3, in the present embodiment, each storage container 7 is formed to have a generally box shape that is capable of enclosing the articles W, In the present example, the storage container 7 has a main body 70 which is configured to support the articles W, and a cover member 71 which is engage able with the main body 70. The main body 70 and the cover member 71 may be separate members or alternatively may be connected to each other by means of one or more connecting members, such as hinges, such that the cover member 71 can be opened and closed.

In the present embodiment, the height 7h (i.e., the vertical dimension) of the storage container 7 is less than the height 8h of the transporting container 8. In addition, in the present example, both the transporting container 8 and the storage container 7 are formed to have a generally rectangular shape (in the present example, a square shape with its four rounded (more particularly circular-arc-shaped) corners) in plan view. In the example shown, the width 7w (length of a side of the outer shape as seen in plan view) of the storage container 7 is less than the width 8w of the transporting container 8. Therefore, the storage container 7 is formed to be smaller than the transporting container 8 in terms of both the dimension along each side as seen in plan view and the vertical dimension.

As such, because each storage container 7 has holding efficiency that is greater than that of a transporting container 8, it is possible to improve storage efficiency of articles W than when storing articles W in the storage structure 1 with these articles still held in transporting containers 8. In addition, because articles W are transported and stored with articles W held in storage containers 7 while inside the storage structure 1, it is possible to reduce the possibility of degradation (for example, damages, contamination, or other lowering of quality) of the articles W, etc., compared with a case in which the articles W are transported and stored without the use of a container to hold them therein.

In addition, the fact that the storage containers 7 are formed to be smaller than the transporting containers 8 facilitates in reducing the distance between adjacent storage locations 13 provided in the storage racks 10. In the present example, in particular, each transporting container 8 has a flange portion 81 that protrudes vertically and a storage container 7 does not have such a flange portion, thus facilitating in reducing the vertical distance between shelf members 12 located one above the other. Therefore, the set number of the storage locations 13 of the storage racks 10 can be increased, thus facilitating in providing arrangements having greater article storage efficiency compared with a case in which articles W are stored in a storage structure 1 with the articles W still held in transporting containers 8.

[Gas Supply System]

As shown in FIG. 1, in the present embodiment, the article storage facility 100 further comprises gas supply systems 5 each configured to supply gas having specific composition to have a specific atmosphere containing gas having specific composition. Examples of such gas having specific composition supplied by the gas supply system 5 include, for example, inert gas (such as nitrogen gas and/or gaseous argon) and air commonly referred to as clean dry air (CDA) which has low humidity and is highly clean. Hereinafter, gas having specific composition will be referred to as the specific gas.

Figure 4:
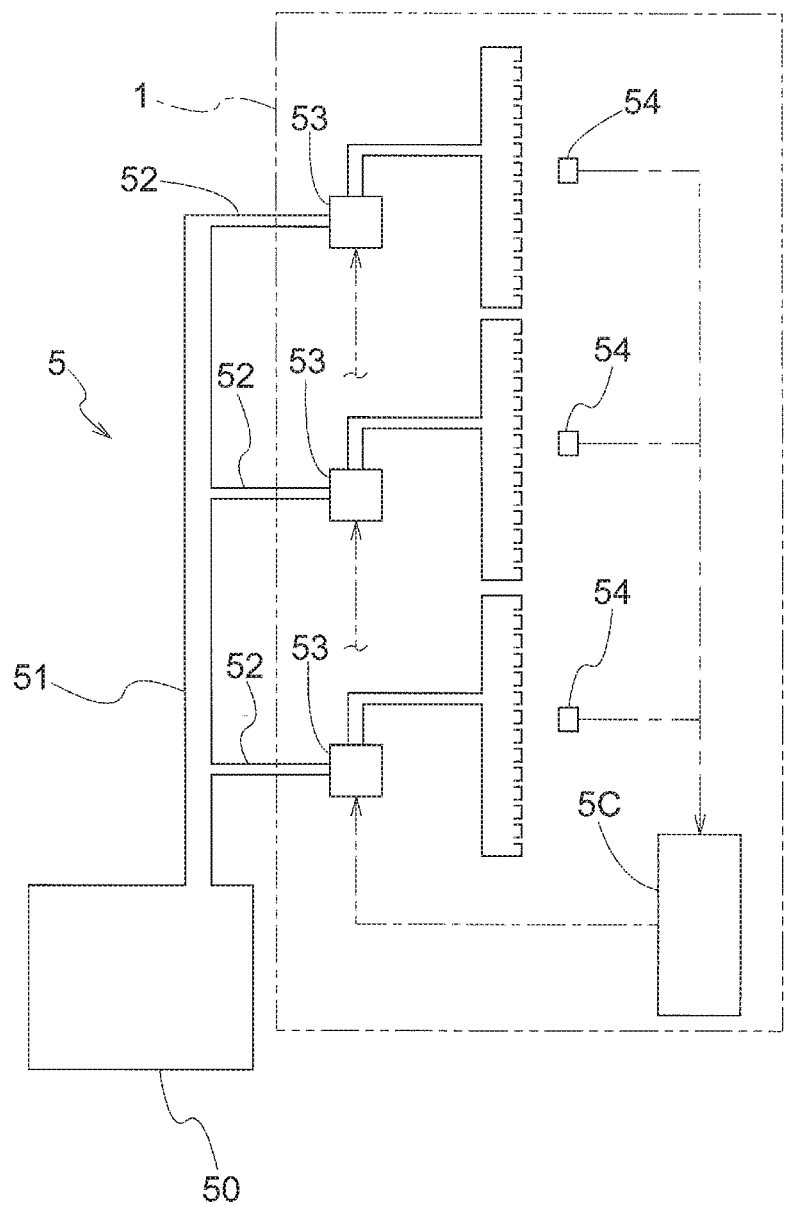

As shown in FIGS. 1 and 4, each gas supply system 5 is configured to supply specific gas to inside the storage structure 1. Here, the gas supply systems 5 supply the specific gas to various areas inside the storage structure 1 so that the concentration of the specific gas is constant throughout different areas inside the storage structure 1. In the present embodiment, each gas supply system 5 comprises: a gas supply source 50, a primary gas line 51 connected to the gas supply source 50, supply gas lines 52 which branch off from the primary gas line 51 to supply specific gas to inside the storage structure 1, a flow rate adjuster 53 (which is an MFC or Mass Flow Controller) provided to each supply gas line 52 to adjust the flow rate of the specific gas flowing therethrough, pressure sensors 54 which measure the pressure inside the storage structure 1, and a flow rate controller 5C which controls the flow rate adjusters 53 based on the measurements made by the pressure sensors 54. The flow rate controller 5C has a CPU, memory circuitry, i/o circuitry to interface with the gauges 54 and the flow rate adjusters 53, and algorithm stored in memory and executable by the CPU to perform required functions. However, the gas supply systems 5 are not limited to such arrangement. A gas supply system 5 may have one or more flow rate sensors (which detect the flow rate of the specific gas) in place of, or in addition to, one or more of the pressure sensors 54. In this case, the flow rate controller 5C may control the flow rate adjusters 53 based on the measurements made by the one or more flow rate sensors.

As shown in FIG. 4, in the present embodiment, the gas supply system 5 is configured to discharge specific gas into the internal space of the storage structure 1. In the present example, the specific gas is discharged into each area of the internal space of the storage structure 1 by means of a plurality of supply gas lines 52. Such an arrangement allows the number of the gas lines for supplying specific gas to be less, which, in turn, allows the numbers of the flow rate adjusters 53 and/or flow rate sensors, etc. to be less than with an arrangement in which specific gas is supplied to each of the set number of storage locations 13.

Thus, in the present embodiment, internal space of the storage structure 1 can have a specific atmosphere containing specific gas by the gas supply system 5. And, as described above, transporting containers 8 which are used to transport articles W outside the storage structure 1 have a structure that allows them to have a greater hermetically sealing capability than the storage containers 7 which are stored inside the storage structure 1. In other words, storage containers 7 have a structure having a lower hermetically sealing capability than the transporting containers 8. Thus, the specific gas supplied to inside the storage structure 1 can enter storage containers 7 without difficulty when the storage containers 7 are inside the storage structure 1. This allows internal space of storage containers 7 to have an environment which is close to the specific atmosphere, which, in turn, allows the possibility of degradation, etc., of the articles W stored in the storage structure 1 to be reduced.

Other Embodiments

Other embodiments of an article storage facility are described next.

(1) In the embodiment described above, an example is described in which either a non-empty storage container 7*f* or an empty storage container 7*e* is stored at each of the set number of storage locations 13. However, the invention is not limited to such an example. Instead, some of the set number of storage locations 13 may be allowed to be empty of either a non-empty storage container 7*f* or an empty storage container 7*e*.

(2) In the embodiment described above, an example is described in which each transporting container 8 has a main body portion 80 having a generally box shape that is capable of enclosing the articles W, and a flange portion 81 (for transporting purposes) formed to protrude from the main body portion 80. However, the invention is not limited to such an example. A transporting container 8 only needs to be configured to be suitable for being transported outside the storage structure 1. For example, a transporting container 8 may have a structure that does not have the flange portion 81.

(3) In the embodiment described above, an example is described in which the second support station 42P is configured to receive a transporting container 8 from an external transport device 3 (which is a ceiling or overhead transport vehicle) configured to transport a transporting container 7. However, the invention is not limited to such an arrangement. The second support station 42P may be configured to receive a transporting container 8 from an external transport device 3 which is a transport vehicle that travels on the floor surface. Alternatively, second support station 42P may be configured to receive a transporting container 8 that is transported manually by a human worker and not by an external transport device 3 such as a ceiling or overhead transport vehicle or a floor-traveling transport vehicle.

(4) In the embodiment described above, an example is described in which, after articles W are carried into the storage structure 1, an empty transporting container 8*e*, which is a transporting container 8 from which the articles W have been removed by the article transfer device 4 and which is now empty of any articles W, is transported by an external transport device 3 to a transport target location located outside the storage structure 1. However, the invention is not limited to such an example. Instead, the empty transporting container 8*e*, which became empty after the articles W were carried into the storage structure 1, may be left placed on the second support station 42P. In this case, such empty transporting container 8e may be utilized when articles W are subsequently retrieved from the storage structure 1.

(5) In the embodiment described above, an example is described in which a storage container 7 is configured to hold a plurality of articles W with greater holding efficiency than that of a transporting container 8 as a result of the fact that the storage container 7 is capable of holding the same number of articles W as the number of the articles W the transporting container 8 is capable of holding and that the volume occupied by the storage container 7 is less than that of the transporting container. However, the invention is not limited to such an example. A storage container 7 may be configured to be capable of holding a greater number articles W than a transporting container 8 is capable of holding. In this case, the storage container 7 may be approximately of the same size as the transporting container 8, or may be larger in size than the transporting containers 8.

(6) In the embodiment described above, an example is described in which each article W is a reticle (photomask). However, articles W are not limited to such an example. When the article storage facility 100 is used in a semiconductor fabrication facility, each article W may be a silicon wafer, for example. In such a case, the article transfer device 4 may be configured to transfer articles W one by one (one article W at a time and without the use of a protection member) between a storage container 7 and a transporting container 8 until all articles W in one of the containers 7, 8 have been transferred to the other. Silicon wafers are also an example of articles W each of which has one or more portions or materials that require a specific atmosphere containing gas having specific composition to maintain required quality. In addition, depending on what the article storage facility 100 is used for, articles W which are transported and stored in the article storage facility 100 may be items other than those mentioned above. For example, when an article storage facility 100 is used in a manufacturing facility for manufacturing products other than semiconductor devices, or in a food processing factory, etc., then the articles W may be products being manufactured or processed, etc.

(7) In the embodiment described above, an example is described in which the internal transport device 2 is a stacker crane. However, the invention is not limited to such an arrangement. The internal transport device 2 may be a transport device that makes use of a conveyor, or a transport vehicle, etc., for example. Alternatively, the internal transport device 2 may be a transport device that has an elevator that extends horizontally along the entire lateral width of the storage racks 10, a horizontally movable member which is movable on the elevator, and a container transfer device which has telescopic arms that are extendable and retractable.

(8) Note that an arrangement disclosed in any of the embodiments described above can also be used in combination with any arrangement disclosed in any other embodiment unless inconsistency arises. Regarding any arrangements and features, the embodiments disclosed in the present description are provided for the purposes of illustration only regarding all aspects. Therefore, it is possible to make various suitable changes without departing from the spirit of the present disclosure.

SUMMARY OF EMBODIMENTS DESCRIBED ABOVE

A brief summary of the article storage facility described above is provided next.

An article storage facility comprises: a storage structure; one or more storage racks provided inside the storage structure and configured to store storage containers; a first support station provided inside the storage structure and configured to support a storage container; an internal transport device configured to transport storage containers, one storage container at a time, between the one or more storage racks and the first support station; a second support station provided outside the storage structure and configured to support a transporting container; an article transfer device; wherein a transporting container is a container that is used to transport articles outside the storage structure, and is configured to hold a plurality of articles therein, wherein a storage container is a container that is used to transport and store articles inside the storage structure, and is configured to hold a plurality of articles with greater holding efficiency than a transporting container, and wherein the article transfer device is configured to transfer articles, one or more articles at a time, between a storage container placed on the first support station and a transporting container placed on the second support station.

With such an arrangement, storage containers, having greater holding efficiency than transporting containers used to transport articles outside the storage structure, are used when storing articles in the storage structure. Thus, the article storage efficiency can be improved compared to a case in which articles are stored in the storage structure with the articles still held in transporting containers. Further, with the arranged described above, because articles are transported and stored with articles held in storage containers inside the storage structure, it is possible to reduce the possibility of degradation, etc., of the articles, compared with a case in which articles are transported and stored without the use of containers to hold them therein.

Here, the one or more storage racks preferably have a set number of storage locations each configured to store a storage container, and wherein either (a) a non-empty storage container which is a storage container with articles held therein, or (b) an empty storage container which is a storage container with no articles held therein is preferably stored at each of the set number of storage locations.

With such an arrangement, a maximum number of storage containers that can be stored in the one or more storage racks can be placed inside the storage structure in advance. And when transferring articles from a transporting container to a storage container by the article transfer device, an empty storage container can be transported from a storage location to a first support station in the storage structure by the internal transport device. Thus, with the arrangement described above, empty storage containers which are needed to receive transferred articles do not need to be kept ready at locations outside the storage structure, or do not need to be transported to the first support station by a device or means other than the internal transport device.

Each storage container is preferably formed to have a generally box shape that is capable of enclosing articles, and wherein each transporting container preferably has a main body portion having a generally box shape that is capable of enclosing articles, and a flange portion, for transporting purposes, which is formed to protrude from the main body portion.

With such an arrangement, the flange portion facilitates the transporting by the transport device with respect to the transporting containers. On the other hand, each storage container is formed to have a generally box shape which does not have a flange portion provided to a transporting container. Thus, each storage container can be made smaller in size while maintaining the article holding efficiency of the storage container. Therefore, the arrangement described above makes it possible to have an arrangement in which transporting of transporting containers outside the storage structure is facilitated while the article holding efficiency inside the storage structure can be improved.

In addition, each article preferably has one or more portions or materials that require a specific atmosphere containing gas having specific composition to maintain required quality, and wherein the article storage facility preferably further comprises one or more gas supply systems each configured to supply gas having the specific composition to have the specific atmosphere containing gas having the specific composition.

The arrangement described above allows the area inside the storage structure to have an environment having a specific atmosphere containing gas having specific composition, thus making it possible to reduce the possibility of degradation, etc., of the articles while being stored.

In an arrangement which includes the one or more gas supply systems, each transporting container preferably has a structure that allows the transporting container to have a greater hermetically sealing capability than a storage container.

The arrangement described above allows the environment inside a transporting container to be isolated from the outside, thus facilitating in reducing any degradation, etc., of the articles during the transporting. On the other hand, storage containers have a lower hermetically sealing capability than the transporting containers, making it easier for the gas having specific composition and filled inside the storage structure to enter the storage containers inside the storage structure. This allows the internal space of each storage container to have an environment which is close to the specific atmosphere, which, in turn, making it possible to reduce the possibility of degradation, etc., of the articles stored in the storage structure.

Also, the second support station is preferably configured to receive a transporting container from an external transport device configured to transport transporting containers, one transporting container at a time, outside the storage structure.

The arrangement described above allows the transporting of a transporting container to the second support station to be performed by the external transport device without having to depend on a manual operation by a human worker.

In addition, the external transport device is preferably configured to transport an empty transporting container, which is a transporting container from which articles are removed by the article transfer device and is empty, from the second support station to a transport target location located outside the storage structure.

With an arrangement described above, an empty transporting container which does not need to hold articles at that time can be removed from the second support station to a location (a transport target location) other than the second support station. This allows, for example, other non-empty transporting container, which holds therein articles W that need to be transferred to a storage container, to be transported to the second support station, thus improving operational efficiency of the facility.

INDUSTRIAL APPLICABILITY

The technology related to the present disclosure can be used in an article storage facility.

What is claimed is:

1. An article storage facility, comprising:
a storage structure;
one or more storage racks provided inside the storage structure and configured to store storage containers;
a first support station provided inside the storage structure and configured to support a storage container of the storage containers;
an internal transport device configured to transport storage containers, one storage container at a time, between the one or more storage racks and the first support station;
a second support station provided outside the storage structure and configured to support a transporting container; and
an article transfer device;
wherein the transporting container is a container that is used to transport articles outside the storage structure, and is configured to hold a plurality of articles therein,
wherein the storage container is a container that is used to transport and store articles inside the storage structure, and is configured to hold a plurality of articles with greater holding efficiency than the transporting container, and
wherein the article transfer device is configured to transfer articles, one or more articles at a time, between the storage container placed on the first support station and the transporting container placed on the second support station.

2. The article storage facility as defined in claim 1, wherein the one or more storage racks have a set number of storage locations each configured to store the storage container, and
wherein either (a) a non-empty storage container which is a storage container with articles held therein, or (b) an empty storage container which is a storage container with no articles held therein is stored at each of the set number of storage locations.

3. The article storage facility as defined in claim 1, wherein each storage container is formed to have a generally box shape that is capable of enclosing articles, and
wherein each transporting container has a main body portion having a generally box shape that is capable of enclosing articles, and a flange portion, for transporting purposes, which is formed to protrude from the main body portion.

4. The article storage facility as defined in claim 1, wherein each article has one or more portions or materials that require a specific atmosphere containing gas having specific composition to maintain required quality, and
wherein the article storage facility further comprises one or more gas supply systems each of which is configured to supply gas having the specific composition to have the specific atmosphere containing gas having the specific composition.

5. The article storage facility as defined in claim 4, wherein each transporting container has a structure that allows the transporting container to have a greater hermetically sealing capability than the storage container.

6. The article storage facility as defined in claim 1, wherein the second support station is configured to receive the transporting container from an external transport device configured to transport transporting containers, one transporting container at a time, outside the storage structure.

7. The article storage facility as defined in claim 6, wherein the external transport device is configured to transport an empty transporting container, that is the transporting container from which articles are removed by the article transfer device and is empty, from the second support station to a transport target location located outside the storage structure.

8. The article storage facility according to claim 1, wherein
the storage container is capable of holding the same number of articles as the number of the articles the transporting container is capable of holding, and
the volume occupied by the storage container is less than that of the transporting container.

9. The article storage facility according to claim 8, wherein
each of the transporting container and the storage container is formed to have a rectangular shape in plan view, and
the storage container is formed to be smaller than the transporting container in terms of both a dimension along each side as seen in plan view and a vertical dimension.

* * * * *